US012635514B2

(12) United States Patent
Park et al.

(10) Patent No.: US 12,635,514 B2
(45) Date of Patent: May 19, 2026

(54) METAL INSULATOR METAL CAPACITOR (MIM CAPACITOR)

(71) Applicant: INTERNATIONAL BUSINESS MACHINES CORPORATION, Armonk, NY (US)

(72) Inventors: Chanro Park, Clifton Park, NY (US); Ruilong Xie, Niskayuna, NY (US); Julien Frougier, Albany, NY (US); Chih-Chao Yang, Glenmont, NY (US); Ashim Dutta, Clifton Park, NY (US); Shravana Kumar Katakam, Lehi, UT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 383 days.

(21) Appl. No.: 18/334,430

(22) Filed: Jun. 14, 2023

(65) Prior Publication Data
US 2024/0421064 A1     Dec. 19, 2024

(51) Int. Cl.
*H10W 20/40*          (2026.01)
(52) U.S. Cl.
CPC .................................. *H10W 20/496* (2026.01)
(58) Field of Classification Search
CPC .......................... H01L 23/5223; H10W 20/496
See application file for complete search history.

(56) References Cited

U.S. PATENT DOCUMENTS

| | | | |
|---|---|---|---|
| 5,675,184 A | 10/1997 | Matsubayashi | |
| 5,879,985 A | 3/1999 | Gambino | |
| 6,287,935 B1 | 9/2001 | Coursey | |
| 6,451,650 B1 | 9/2002 | Lou | |
| 6,461,914 B1 | 10/2002 | Roberts | |
| 6,620,701 B2 * | 9/2003 | Ning .................... | H10D 84/212 |
| | | | 257/E21.018 |
| 6,670,237 B1 * | 12/2003 | Loh ..................... | H01L 23/5223 |
| | | | 438/210 |
| 6,764,915 B2 | 7/2004 | Lee | |

(Continued)

OTHER PUBLICATIONS

Bordo et al., "Effect of Deposition Rate on Structure and Surface Morphology of Thin Evaporated Al Films on Dielectrics and Semiconductors", ISSN 1392-1320, Materials Science, vol. 18, No. 4, 2012, pp. 313-317.

(Continued)

*Primary Examiner* — Patricia D Valenzuela
(74) *Attorney, Agent, or Firm* — L. Jeffrey Kelly

(57) ABSTRACT

A semiconductor device including a metal insulator metal capacitor (MIM capacitor) within back end of line circuitry, where a bottom electrode of the MIM capacitor includes a plurality of vertical pillars extending up from a bottom layer. A semiconductor device including a metal insulator metal capacitor (MIM capacitor), where a bottom electrode of the MIM capacitor includes a plurality of vertical pillars extending up from a bottom layer. Forming back end of line Mx-1 metal line layer, forming a plurality of Vx-1 via on the Mx-1 metal line layer, forming Mx metal line layer with subtractive patterning on the plurality of the Vx-1 via, forming a plurality of Vx via on the Mx metal line layer with subtractive patterning; and forming a block mask protecting a portion of the semiconductor device.

20 Claims, 18 Drawing Sheets

103

(56) References Cited

U.S. PATENT DOCUMENTS

| | | | |
|---|---|---|---|
| 6,914,769 | B2 | 7/2005 | Welsch |
| 6,977,805 | B2 | 12/2005 | Takada |
| 7,034,353 | B2 | 4/2006 | Thakur |
| 7,091,542 | B1 | 8/2006 | Yang |
| 7,244,999 | B2 | 7/2007 | Aihara |
| 7,317,221 | B2 | 1/2008 | Chang |
| 7,638,830 | B2 | 12/2009 | Hsin |
| 8,191,217 | B2 | 6/2012 | Dunn |
| 9,252,204 | B2 | 2/2016 | Adkisson |
| 9,252,294 | B2 | 2/2016 | Latham |
| 9,324,780 | B2 | 4/2016 | Jen |
| 9,391,069 | B1 | 7/2016 | Cheng |
| 10,497,582 | B2 | 12/2019 | Voiron |
| 10,714,419 | B2 | 7/2020 | Leobandung |
| 11,031,457 | B2 | 6/2021 | Li |
| 11,239,307 | B2 * | 2/2022 | Zhu ................... H01L 21/76883 |
| 11,437,312 | B2 | 9/2022 | Liang |
| 11,545,544 | B2 | 1/2023 | Leng |
| 2006/0189069 | A1 | 8/2006 | Coolbaugh |
| 2019/0051596 | A1 | 2/2019 | Suo |
| 2019/0378793 | A1 | 12/2019 | Cheng |
| 2021/0028165 | A1 | 1/2021 | Yu |
| 2022/0336577 | A1 | 10/2022 | Leng |

OTHER PUBLICATIONS

Brunet et al., "High-Density 3-D Capacitors for Power Systems On-Chip: Evaluation of a Technology Based on Silicon Submicrometer Pore Arrays Formed by Electrochemical Etching", IEEE Transactions on Power Electronics, vol. 28, No. 9, Sep. 2013, pp. 4440-4448.

Melo et al., "Grain Sizes and Surface Roughness in Platinum and Gold Thin Films", Journal of Metastable and Nanocrystalline Materials, vols. 20-21, 2004, © 2004 Trans Tech Publications, Switzerland, pp. 623-628.

* cited by examiner

Section X-X

Section X-X

Section X-X

METAL INSULATOR METAL CAPACITOR (MIM CAPACITOR)

BACKGROUND

The present invention relates, generally, to the field of semiconductor manufacturing, and more particularly to a metal-insulator-metal (MIM) capacitor.

MIM capacitors are a key element for integration of system-on-chips, improving both circuit performance and down-scaling capability. A typical MIM capacitor includes a top metal electrode, a dielectric/insulator layer and a bottom metal electrode. Voltage is applied across the metal electrodes which results in charge storage within the formed capacitor configuration. MIM capacitors are used in functional circuits such as mixed signal circuits, analog circuits, radio frequency (RF) circuits, dynamic random access memory (DRAM), embedded DRAM, and logic operation circuits. In general, for a MIM capacitor in an RF application, a dielectric loss must be extremely small, and a series resistance of the wiring should be minimized for high frequency applications. This indicates that it is desirable to use short interconnect wires with a low specific resistance. A MIM capacitor integrated in back end of line (BEOL) metallization is suitable to fulfill these requirements.

The MIM capacitor is usually embedded into upper back-end-of-the-line (BEOL) layers. Traditional methods of fabricating a MIM capacitor include stacking of multiple MIM capacitor layers that involve numerous lithography and etching steps. Some MIM capacitor designs, require many extra processing steps that may not be easily integrable into a conventional BEOL process. A complexity of current MIM capacitor fabrication methods can cause problems during the semiconductor manufacturing process that can hinder capacitance density increase and yield improvement.

SUMMARY

According to an embodiment of the present invention, a semiconductor device is provided. The semiconductor device including a metal insulator metal capacitor (MIM capacitor) within back end of line circuitry, where a bottom electrode of the MIM capacitor includes a plurality of vertical pillars extending up from a bottom layer.

According to an embodiment of the present invention, a semiconductor device is provided. The semiconductor device including a metal insulator metal capacitor (MIM capacitor), where a bottom electrode of the MIM capacitor includes a plurality of vertical pillars extending up from a bottom layer.

According to an embodiment of the present invention, a method is provided. The method including forming back end of line Mx-1 metal line layer, forming a plurality of Vx-1 via on the Mx-1 metal line layer, forming Mx metal line layer with subtractive patterning on the plurality of the Vx-1 via, forming a plurality of Vx via on the Mx metal line layer with subtractive patterning; and forming a block mask protecting a portion of the semiconductor device.

BRIEF DESCRIPTION OF THE DRAWINGS

The following detailed description, given by way of example and not intended to limit the invention solely thereto, will best be appreciated in conjunction with the accompanying drawings, in which:

FIG. 13 illustrates a cross-sectional view of a second semiconductor structure at an intermediate stage of fabrication, according to an exemplary embodiment;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
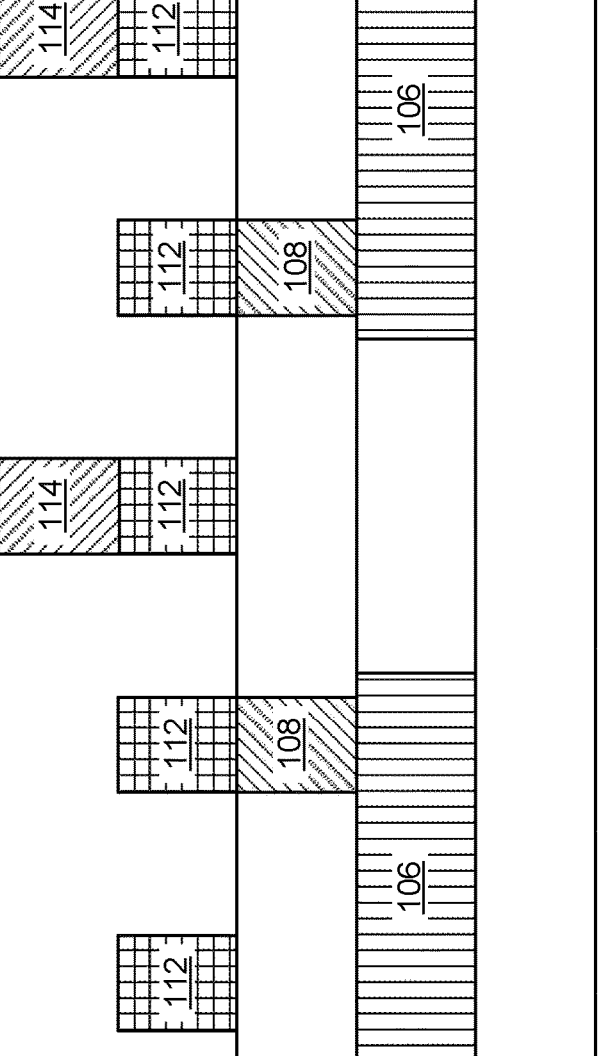
FIG. 1 illustrates a cross-sectional view of a first portion of a first semiconductor structure at an intermediate stage of fabrication, according to an exemplary embodiment.
Figure 1:
Figure 1:
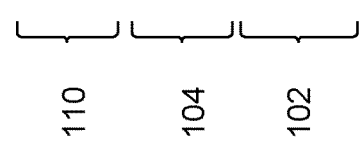

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates, generally, to the field of semiconductor manufacturing, and more particularly to a metal-insulator-metal (MIM) capacitor.

In convention formation of a MIM capacitor, there are several concerns. A first concern is that two additional masks are needed to form the MIM capacitor. A second concern is the use of copper (Cu) which is used as in the back-end-of-line (BEOL) metal lines and vias, has a reliability issue. A third concern is that the MIM capacitor is limited by available surface areas. Traditional methods of forming a MIM capacitor using copper (Cu) for each of the top electrode and the bottom electrode has the following issue, removal of an inter-layer dielectric exposes the copper electrodes, which is susceptible to chemical and physical damage by plasma. The plasma used to etch dielectric material can be either fluorine based or chlorine based depending on the dielectric material. The copper is exposed to the plasma during dielectric etching and is susceptible to damage, especially chemical damage which causes corrosion of the exposed copper. An additional concern is that the copper profile is negative with a wide upper surface and a narrow lower surface, which makes gap fill difficult and has risk of voids, resulting in a reliability issue.

It is preferable to not use copper as a bottom electrode due to the negative profile, because when the top electrode is deposited there is a voiding issue due to the negative profile of the bottom electrode formed with copper.

In this invention, the MIM capacitor formation is compatible with subtractive BEOL integration, using existing metal layers as electrodes. The MIM capacitor has higher capacitance with low series resistance. The MIM capacitor needs only 1 additional (block) mask to open the BEOL MIM capacitor area.

The conductive material layer of the bottom electrode may include materials such as, for example ruthenium (Ru), tungsten (W), molybdenum (Mo), iridium (Ir), and rhodium (Rh), rather than copper (Cu). These materials are not susceptible to chemical and physical damage by plasma. The top electrode may include materials such as tungsten (W), tantalum nitride (TaN) and titanium nitride (TiN).

The bottom electrode of the MIM capacitor may include vias and metal lines of the BEOL. Select Vx-1 vias, Vx vias, and portions of Mx-1 metal lines and Mx metal lines may be used to form the bottom electrode of the MIM capacitor. Remaining Vx-1 vias, Vx vias, Mx-1 metal lines and Mx metal lines may be used as normal function components of a semiconductor device. These may be formed by subtractive patterning. A grouping of a subset of vias and metal lines may provide a comb like structure for the bottom electrode which increases a surface area of the bottom electrode, and a capacitance of the MIM capacitor. It is preferrable to have a positive line profile (narrow top/wide bottom) for the bottom electrode to allow for a void-free gap fill for the top electrode, which does not have a reliability concern.

A selective metallic deposition may be formed on a surface of the bottom electrodes. This selective metallic deposition may have an uneven rough surface which increases a surface area of the bottom electrode, further increasing a capacitance of the MIM capacitor. A high-k liner on the selective metallic deposition on the bottom electrode is formed and is the dielectric between the bottom electrode and the top electrode. A top electrode is formed on the high-k liner, filling areas between the comb structure of the bottom electrodes, forming a complementary comb like structure. The top electrode is formed by damascene. The top electrode material is deposited on the high-k film and overburden is polished off by CMP process).

This formation of the MIM capacitor results in a capacitor with low wiring series resistance. The line resistance of ruthenium (Ru) (one of the candidates for BEOL metal which is formed by subtractive patterning) is less than that of Cu when line width becomes less than certain dimension (~9 nm). Other candidate metals which are known to have less resistance than copper (Cu) at a smaller line width include rhodium (Rh) and iridium (Ir).

This formation of the MIM capacitor does not have physical and chemical damage to the bottom electrode because the bottom electrode is formed using subtractive patterning and are not subject to plasma damage.

During formation of the high-k liner on the bottom electrode, and formation of the top electrodes, remaining portions of the semiconductor structure may have a protective mask, such as a organic planarization layer. This is the one block mask used in this invention.

A quality (Q) factor of a capacitor is capacitance per unit area. The Q Factor is dependent upon a surface area between a top electrode and a bottom electrode. A conventional MIM capacitor fabrication has a low Q factor due to a limited area or size of the MIM capacitor. A conventional MIM capacitor is difficult to scale for more advanced nodes.

A node is a generation of technology, for example 10 nm, 7 nm, 5 nm and so on. An advanced node at this moment is 3 nm and below, but the definition is subject to change where the current technology stands. A conventional MIM capacitor has higher real estate, which is a low Q factor due to a limited area or size of the MIM capacitor.

In this invention, a comb shaped top electrode and complementary comb shaped bottom electrode provide a MIM capacitor with a higher Q factor. The comb shaped electrodes provide high density scaling for advanced nodes. The comb shaped electrodes allow for low real estate usage due to a high surface area/size.

The patterning of the bottom comb shaped electrode may be patterned using a single subtractive etch. The top electrode may be formed through physical vapor deposition (PVD), chemical vapor deposition (CVD, atomic layer deposition (ALD), or plating deposition techniques. Advantages of the single subtractive etch include elimination of void forming in the material of the bottom comb shaped electrode.

A capacitance surface area is maximized by reducing a pitch of width of the bottom electrode. The pitch may be 40 nm or 80 nm. The pitch is a repeating unit of line & space. A pitch of 40 nm assumes metal lines are 20 nm wide and spacers between metal lines are 20 nm wide.

A contact area between the bottom electrode and an insulating layer of the MIM capacitor is larger than a footprint area of the MIM capacitor due to the comb shaped electrodes. An upper horizontal surface of the bottom electrode is above a lower horizontal surface of the top electrode due to the comb shaped electrodes.

The present invention relates, generally, to the field of semiconductor manufacturing, and more particularly to a metal-insulator-metal (MIM) capacitor.

Figure 2:
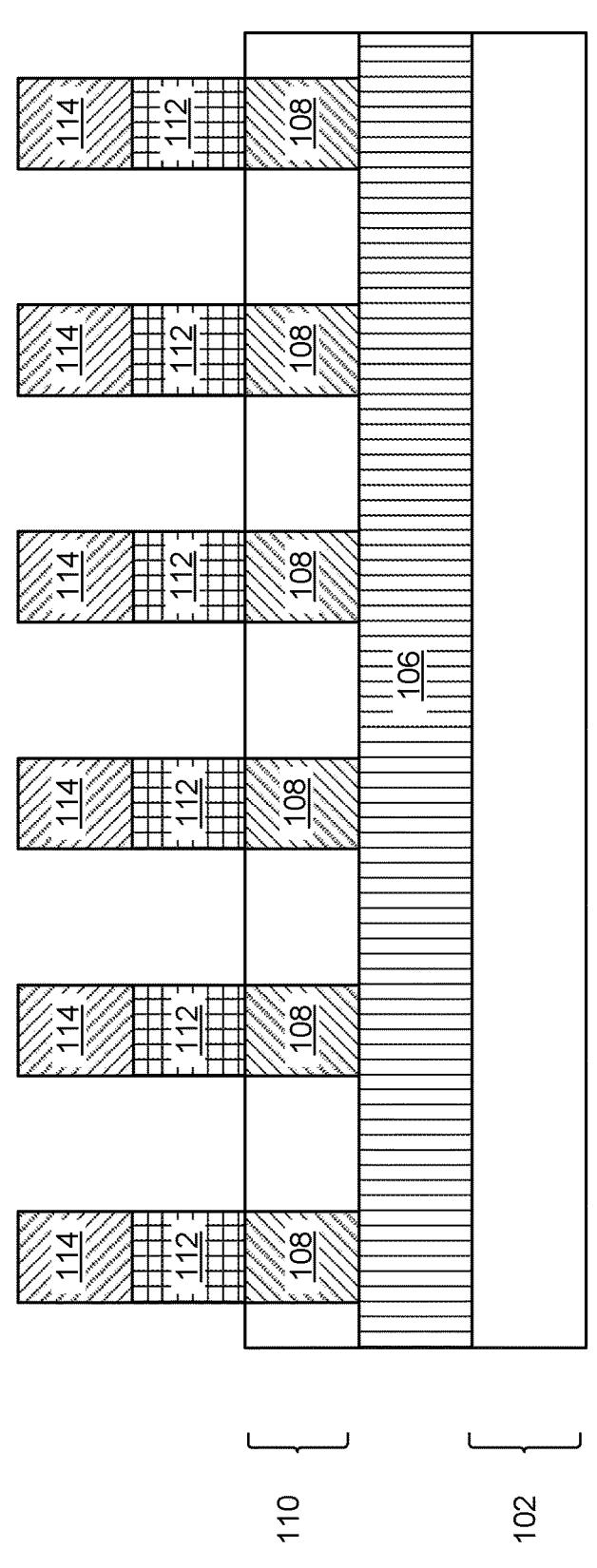
FIG. 2 illustrates a cross-sectional view of a second portion of the first semiconductor structure at an intermediate stage of fabrication, according to an exemplary embodiment.

Referring now to FIGS. 1 and 2, a cross-sectional view of a structure 101 of a first portion of a semiconductor structure 100 (hereinafter "structure") and a structure 103 of a second portion of the structure 100, respectively, each at an intermediate stage of fabrication are shown according to an exemplary embodiment. FIG. 1 is a cross-sectional view of the structure 101. FIG. 2 is a cross-sectional view of the structure 103. The structure 100, 101, 103 may be formed or provided. The structure 101, 103 may include an inter-layer dielectric (hereinafter "ILD") 102, an inter-layer dielectric (hereinafter "ILD") 104, an Mx-1 metal line 106, an inter-layer dielectric (hereinafter "ILD") 110, a Vx-1 via 108, an Mx metal line 112 and a Vx via 114.

The structure 101 may be an interconnect region. The structure 103 may include a metal-insulator-metal (hereinafter "MIM") capacitor.

The structure 101, 103 may include several back end of line ("BEOL") layers. In general, the back end of line (BEOL) is the second portion of integrated circuit fabrication where the individual devices (transistors, capacitors, resistors, etc.) are interconnected with wiring on the wafer.

The ILD 102 may be formed by depositing or growing a dielectric material on the BEOL layers. The ILD 102 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the ILD 102 may include one or more layers. In an embodiment, the ILD 104 may include any dielectric material such as tetraethyl orthosilicate (TEOS), silicon oxide (SiOx), silicon nitride (SiNx), silicon boron carbonitride (SiBCN), NBLoK, a low-k dielectric material (with k<4.0) such as SiCOH, SiCNH and SiCNOH, including but not limited to, silicon oxide, spin-on-glass, a flowable oxide, a high-density plasma oxide, borophosphosilicate glass (BPSG), or any combination thereof or any other suitable dielectric material. NBLoK is a trademark of Applied Materials, Inc.

The ILD 104 may be formed as described for the ILD 102, directly on an upper horizontal surface of the ILD 102.

The Mx-1 metal line 106 may be formed by first patterning a trench (not shown) into the ILD 104. In an embodiment, the Mx-1 metal line 106 is formed from a conductive material layer which is blanket deposited on top of the structure 100, and directly on an upper horizontal surface of the ILD 104, filling the trench (not shown). The conductive material layer may include materials such as, for example copper (Cu), ruthenium (Ru), tungsten (W), tantalum nitride (TaN) and titanium nitride (TiN). The conductive material can be formed by for example, electrochemical deposition (ECD), chemical vapor deposition (CVD), physical vapor deposition (PVD), and atomic layer deposition (ALD) or a combination thereof. The Mx-1 metal line 106 is formed by damascene, or patterned from the conductive material layer, using known patterning and etching techniques. There may be any number of trenches in the ILD 104, each filled with the Mx-1 metal line 106, on the structure 100.

A planarization process, such as, for example, chemical mechanical polishing (CMP), may be done to remove excess material from an upper horizontal surface of the structure 100 such that upper horizontal surfaces of the Mx-1 metal line 106 and the ILD 104 are coplanar. In an embodiment, the Mx-1 metal wire 128 may have a thickness ranging from about 10 nm to about 200 nm, although a thickness less than 10 nm and greater than 200 nm may be acceptable.

The ILD 110 may be formed as described for the ILD 102, directly on an upper horizontal surface of the Mx-1 metal line 106 and the ILD 104.

The Vx-1 via 108 may be formed by first patterning an opening (not shown) into the ILD 110, and filling the opening. In an embodiment, the Vx-1 via 108 is formed from a conductive material layer which is blanket deposited on top of the structure 100, and directly on an upper horizontal surface of the ILD 110, filling the opening (not shown). The conductive material layer may include materials such as, for example copper (Cu), ruthenium (Ru), cobalt (Co), tungsten (W). The conductive material can be formed by for example, chemical vapor deposition (CVD), physical vapor deposition (PVD), and atomic layer deposition (ALD) or a combination thereof. The Vx-1 via 108 is formed by damascene, or patterned from the conductive material layer, using known patterning and etching techniques. There may be any number of openings in the ILD 110, each filled with the Vx-1 via 108 on the structure 100.

A planarization process, such as, for example, chemical mechanical polishing (CMP), may be done to remove excess material from an upper horizontal surface of the structure 100 such that upper horizontal surfaces of the Vx-1 via 108 and the ILD 110 are coplanar. In an embodiment, the Vx-1 via 108 may have a thickness ranging from about 10 nm to about 50 to 150 nm, although a thickness less than 50 nm and greater than 150 nm may be acceptable.

A first inter-layer dielectric (not shown) may be formed as described for the ILD 102, directly on an upper horizontal surface of the Vx-1 via 108 and the ILD 110.

Material for the Mx metal line 112 and the Vx via 114 may be deposited using typical deposition techniques, for example, atomic layer deposition (ALD), molecular layer deposition (MLD), and chemical vapor deposition (CVD). The the Mx metal line 112 and the Vx via 114 may include materials such as, for example ruthenium (Ru), tungsten (W), molybdenum (Mo), iridium (Ir), and rhodium (Rh), rather than copper (Cu). The Mx metal line 112 and the Vx via 114 are formed by a subtractive patterning process.

Figure 3:
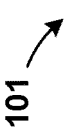
FIGS. 3 and 4 illustrates a cross-sectional view of the first and second portions of the first semiconductor structure and illustrates formation of an inter-layer dielectric, according to an exemplary embodiment.
Figure 3:
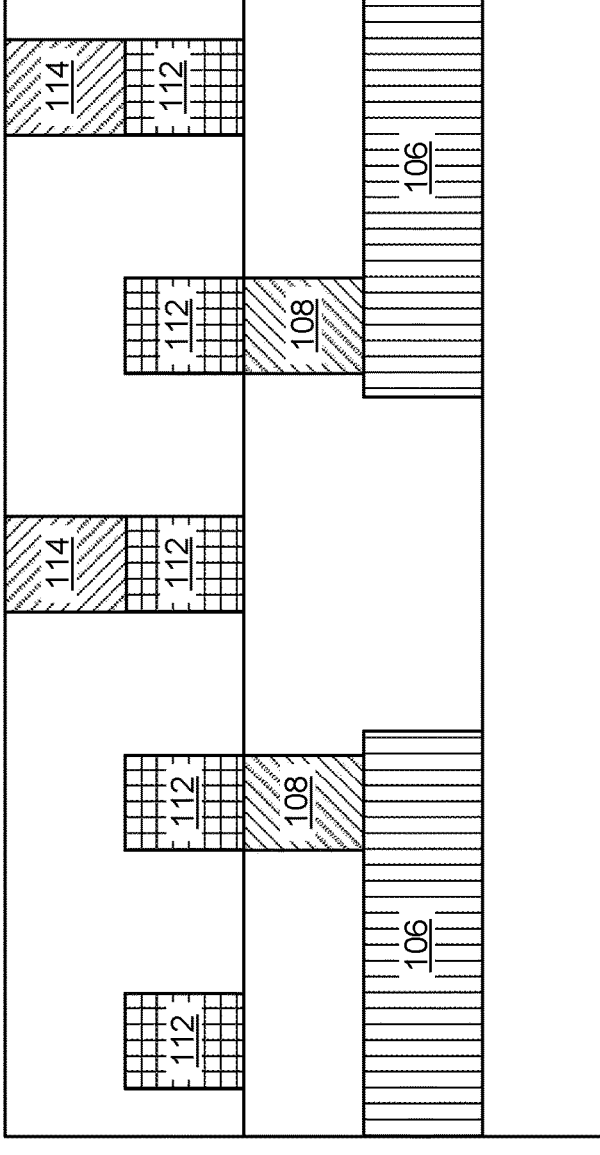
Figure 3:
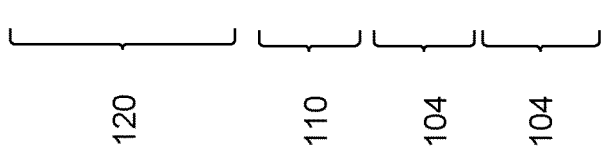
Figure 4:
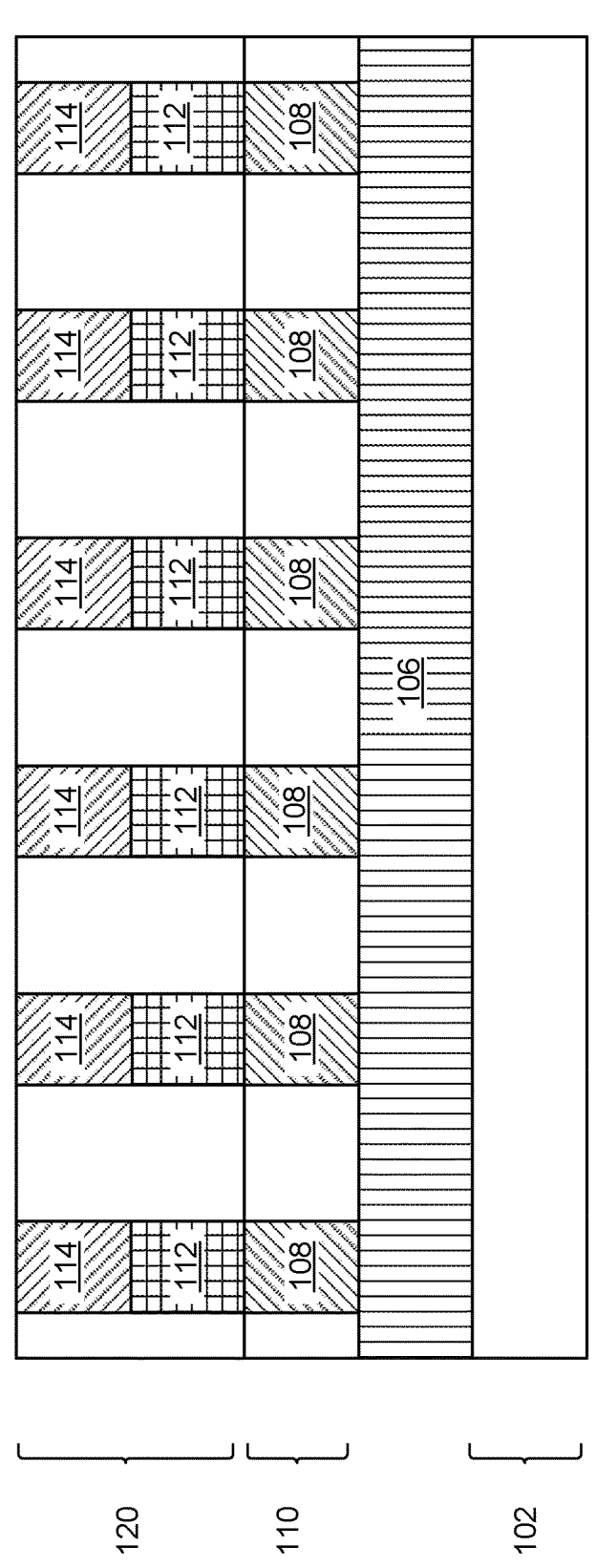

Referring now to FIGS. 3 and 4, a cross-sectional view of the structure 101 and the structure 103 are each shown according to an exemplary embodiment. FIG. 3 is a cross-sectional view of the structure 101. FIG. 4 is a cross-sectional view of the structure 103. An inter-layer dielectric (hereinafter "ILD") 120 may be formed.

The ILD 120 may be formed as described for the ILD 102, directly on an upper horizontal surface of the ILD 110, on an upper horizontal surface of the Mx metal line 112 and surrounding vertical side surfaces of the Mx metal line 112 and the Vx via 114.

A planarization process, such as, for example, chemical mechanical polishing (CMP), may be done to remove excess material from an upper horizontal surface of the structure 100 such that upper horizontal surfaces of the Vx via 114 and the ILD 120 are coplanar.

Figure 5:
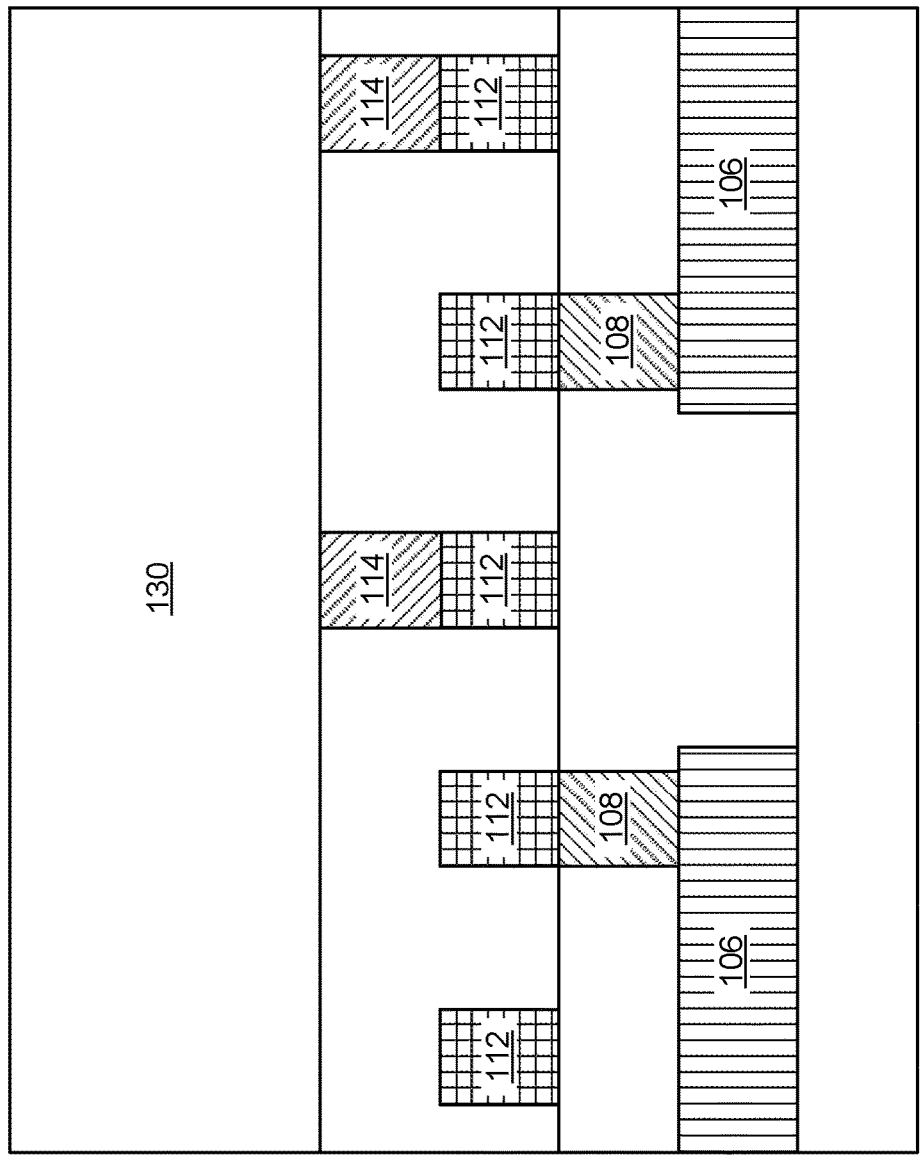
FIGS. 5 and 6 illustrates a cross-sectional view of the first and second portions of the first semiconductor structure and illustrates formation of an organic planarization layer, according to an exemplary embodiment.
Figure 5:
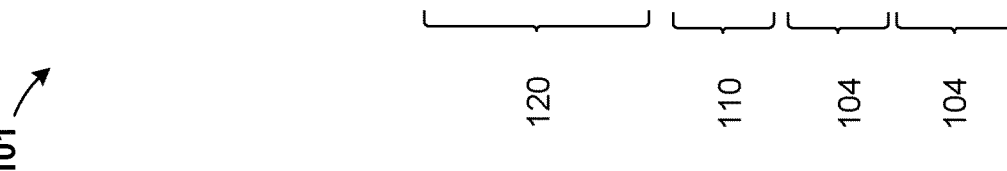
Figure 6:
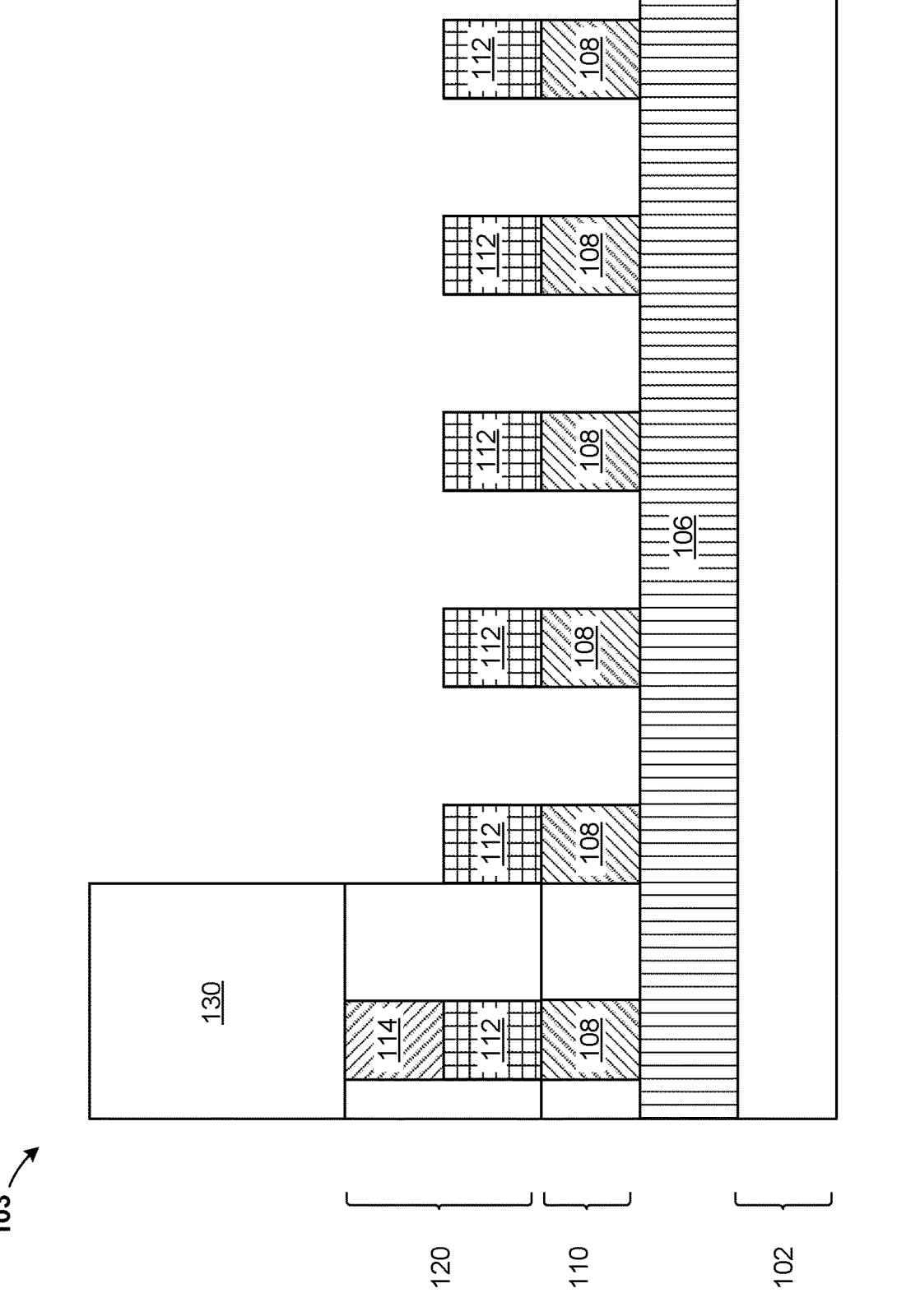

Referring now to FIGS. 5 and 6, a cross-sectional view of the structure 101 and the structure 103 are each shown according to an exemplary embodiment. FIG. 5 is a cross-sectional view of the structure 101. FIG. 6 is a cross-sectional view of the structure 103. An organic planarization layer 130 (hereinafter "OPL") may be formed. Portions of the OPL 130, portions of the ILD 120 and portions of the ILD 110 may be removed.

The OPL 130 may be formed by a blanket deposition using typical deposition techniques, for example spin-on coating. The OPL 130 can be a self-planarizing organic material that includes carbon, hydrogen, oxygen, and optionally nitrogen, fluorine, and silicon. The OPL 130 can be a standard CxHy polymer. Non-limiting examples of materials include, but are not limited to, CHM701B, commercially available from Cheil Chemical Co., Ltd., HM8006 and HM8014, commercially available from JSR Corporation, and ODL-102 or ODL-401, commercially available from ShinEtsu Chemical, Co., Ltd.

A lithograph patterning and dry etch technique may be used to selectively remove portions of the OPL 130 in the structure 103, exposing the MIM capacitor region. The OPL 130 may remain in the structure 101, which is an interconnect region.

Portions of the ILD 120 and portions of the ILD 110 may be selectively removed which are not covered by the OPL 130. An upper horizontal surface and a vertical side surface of the Mx metal line 112 may be exposed in the MIM capacitor region. A vertical side surface of the Vx-1 via may be exposed in the MIM capacitor region. An upper horizontal surface of the Mx-1 metal line 106 may be exposed in the MIM capacitor region.

The OPL 130 may protect the ILD 120, the Vx via 114, the Mx metal line 112, the Vx-1 via 108 in the interconnect region.

Figure 7:
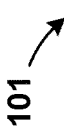
FIGS. 7 and 8 illustrates a cross-sectional view of the first and second portions of the first semiconductor structure and illustrates removal of the organic planarization layer, according to an exemplary embodiment.
Figure 7:
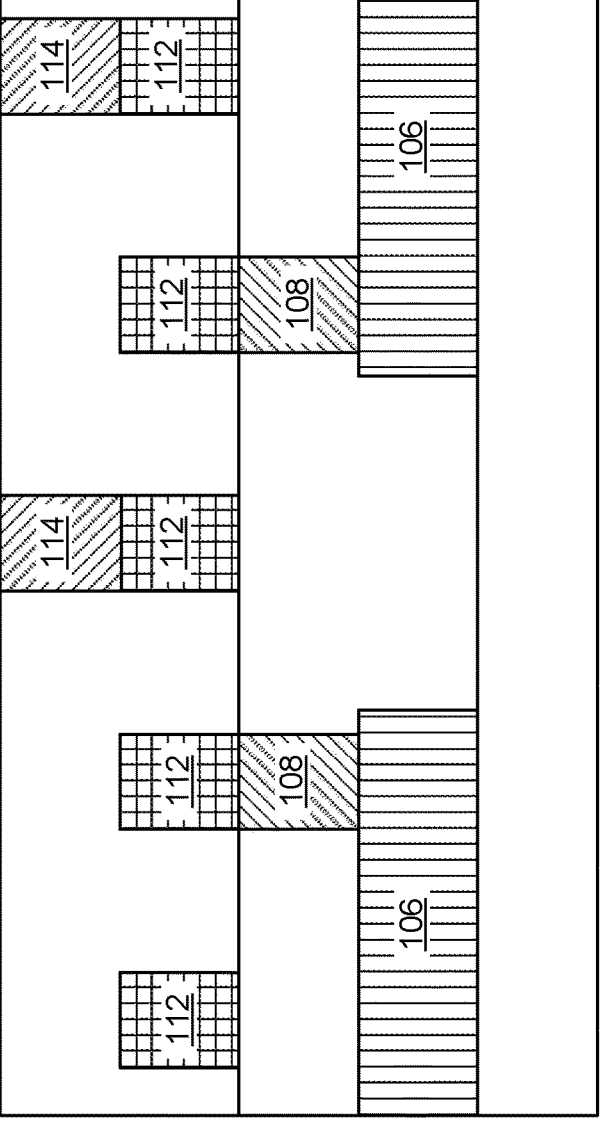
Figure 7:
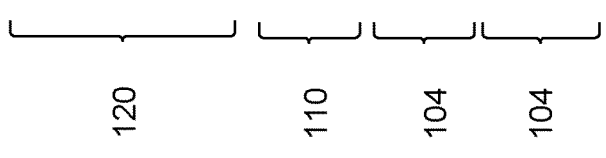
Figure 8:
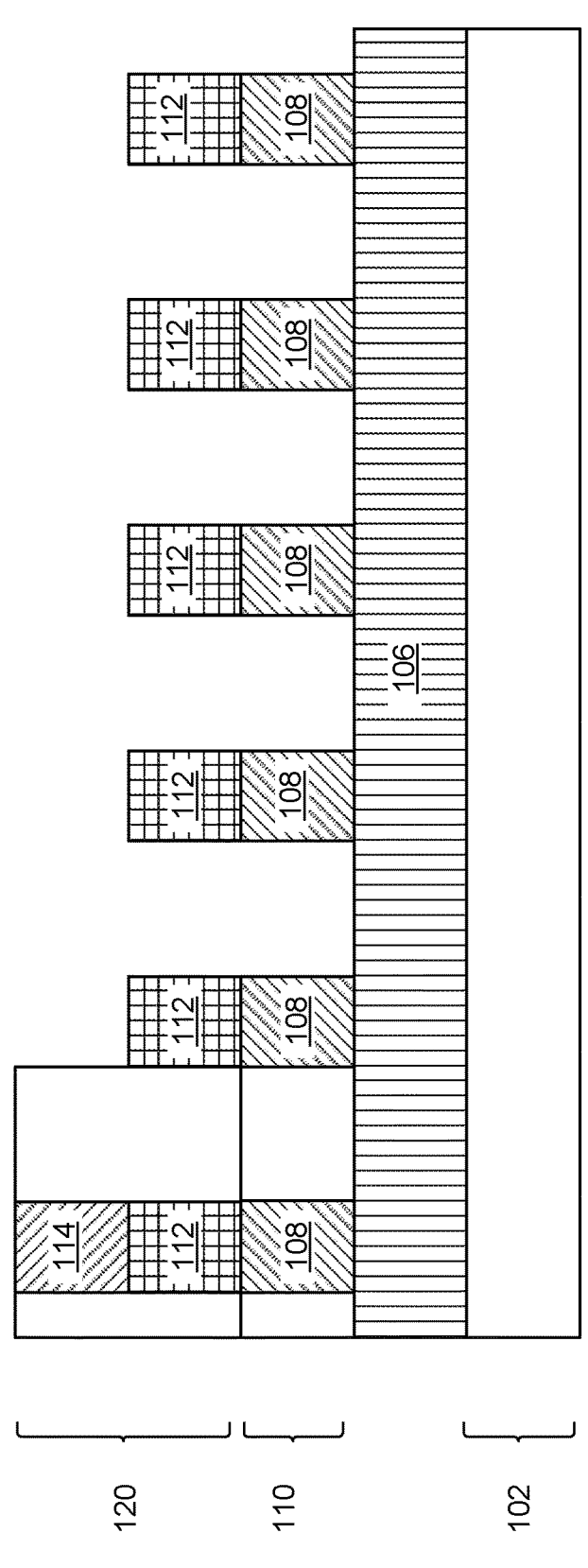

Referring now to FIGS. 7 and 8, a cross-sectional view of the structure 101 and the structure 103 are each shown according to an exemplary embodiment. FIG. 7 is a cross-sectional view of the structure 101. FIG. 8 is a cross-sectional view of the structure 103. The OPL 130 may be removed.

Remaining portions of the OPL 130 may be removed by methods known in the arts.

Figure 9:
FIGS. 9 and 10 illustrates a cross-sectional view of the first and second portions of the first semiconductor structure and illustrates a partial metal nucleation, according to an exemplary embodiment.
Figure 9:
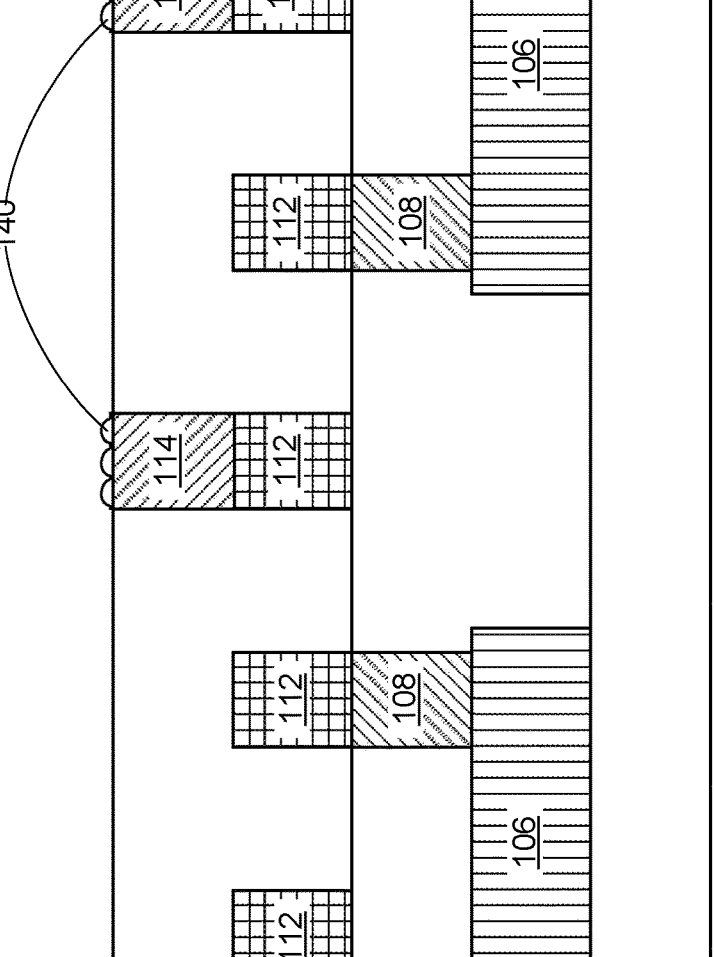
Figure 9:
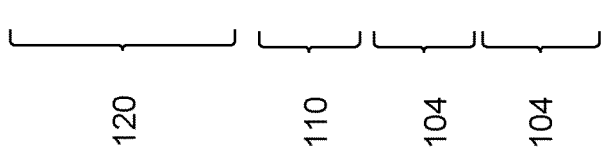
Figure 10:
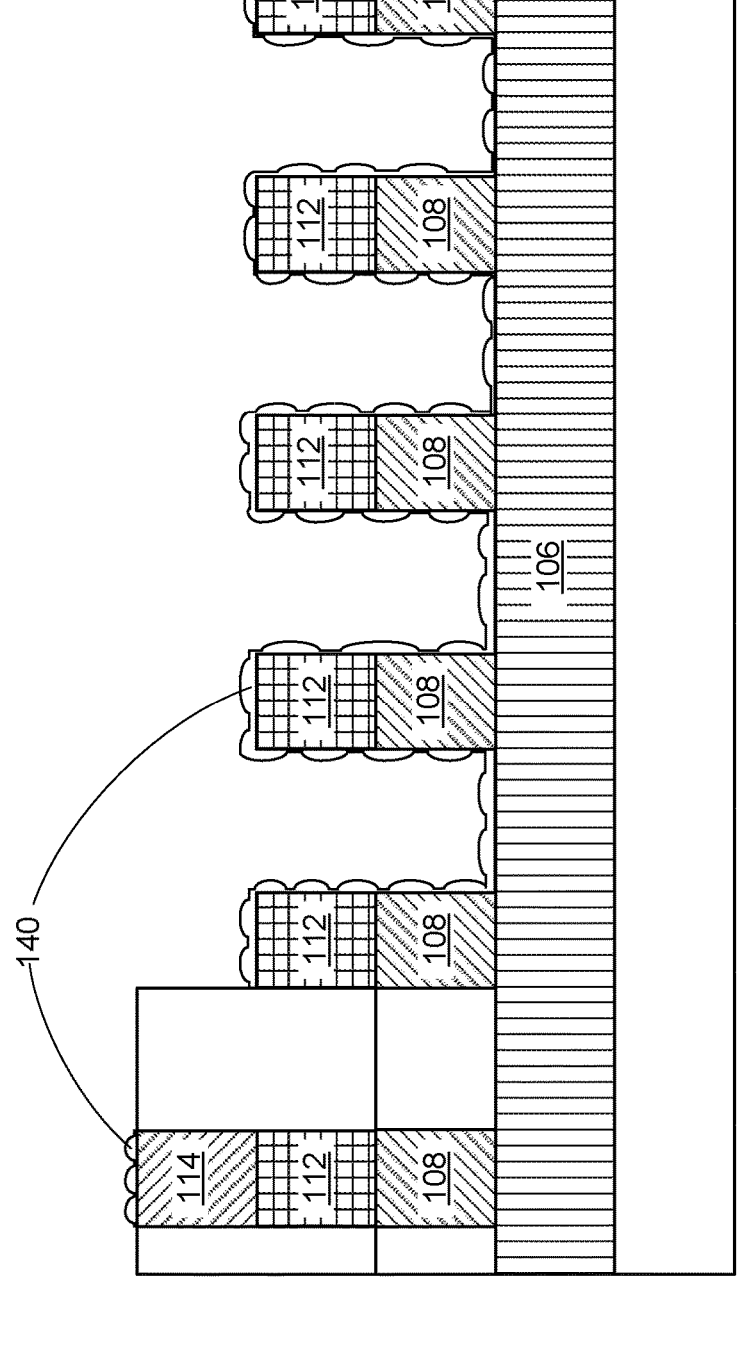

Referring now to FIGS. 9 and 10, a cross-sectional view of the structure 101 and the structure 103 are each shown according to an exemplary embodiment. FIG. 9 is a cross-sectional view of the structure 101. FIG. 10 is a cross-sectional view of the structure 103. A partial metal nucleation layer 140 may be formed.

The partial metal nucleation layer 140 may be formed with an uneven rough surface. The partial metal nucleation layer 140 may be formed as a selective metallic deposition which only adheres to exposed metal surfaces of the structures 101, 103. Material used for the thin film layer may include aluminum (Al), platinum (Pt), cobalt (Co) and gold (Au). The partial metal nucleation layer 140 may be deposited by a vapor deposition CVD process. The partial metal nucleation layer 140 may be alternatively be referred to as metal nucleation layer 140.

The partial metal nucleation layer 140 may be deposited on an exposed upper horizontal surface of the Vx via 114. The partial metal nucleation layer 140 may be deposited on an exposed upper horizontal and vertical side surfaces of the Mx metal line 112. The partial metal nucleation layer 140 may be deposited on an exposed vertical side surface of the Vx-1 via 108. The partial metal nucleation layer 140 may be deposited on an exposed upper horizontal surface of the Mx-1 metal line 106. Exposed surfaces of the structures 101, 103 get roughened by the partial nucleation of metal and thus a surface area is increased.

The bottom electrode of the MIM capacitor includes the vertically aligned stack of the Vx via 114, the Mx metal line 112 and the Vx-1 via 108, stacked on the Mx-1 metal line 106, and the illustrated 5 stacks of the Mx metal line 112 with the Vx-1 via 108. The bottom electrode of the MIM capacitor includes the Mx metal lines 112, the Vx-1 vias 108 and the Mx-1 metal line 106. There may be any number of these components in the bottom electrode of the MIM capacitor in the structure 100. The uneven rough surface of partial metal nucleation layer 140 increases a surface area of the bottom electrode of the MIM capacitor, and increases a capacitance of the MIM capacitor.

The MIM capacitor may be formed alongside other components of the structure 100, where additional components of the Mx-1 metal line 106, the Vx via 114, the Mx metal line 112 and the Vx-1 via 108 are part of normal operation components of the structure 100. Select portions or components of Mx-1 metal line 106, the Vx via 114, the Mx metal line 112 and the Vx-1 via 108 may be incorporated into the MIM capacitor and formed simultaneously as normal function components of the structure 100.

Figure 11:
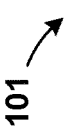
FIGS. 11 and 12 illustrates a cross-sectional view of the first and second portions of the first semiconductor structure and illustrates formation of a high-k liner and formation of a top electrode, according to an exemplary embodiment.
Figure 11:
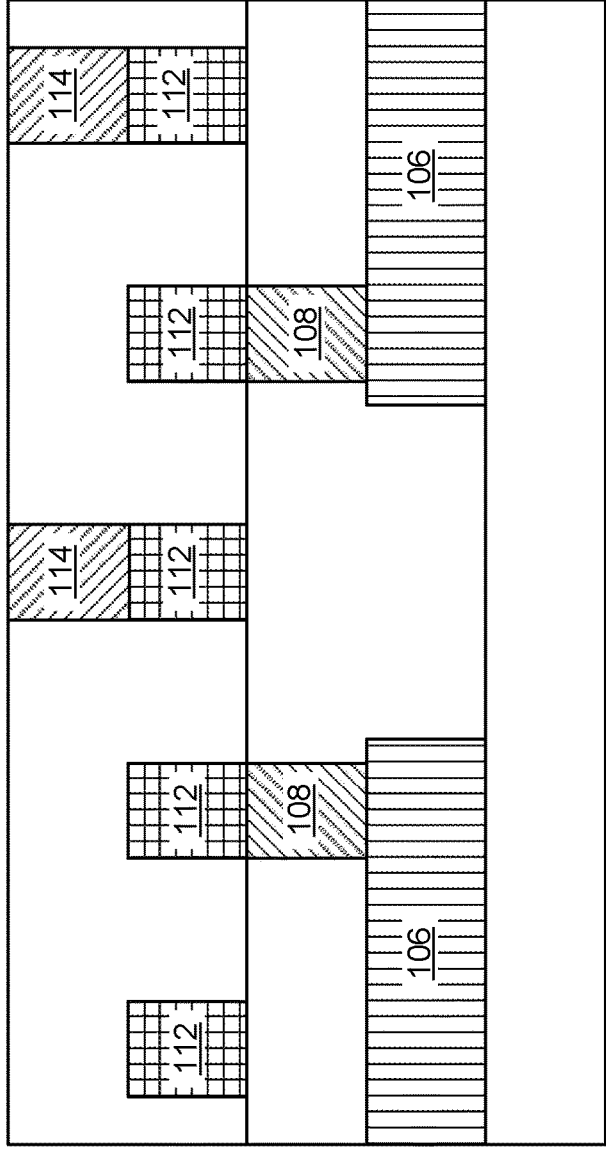
Figure 11:
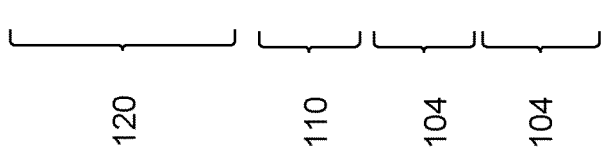
Figure 12:
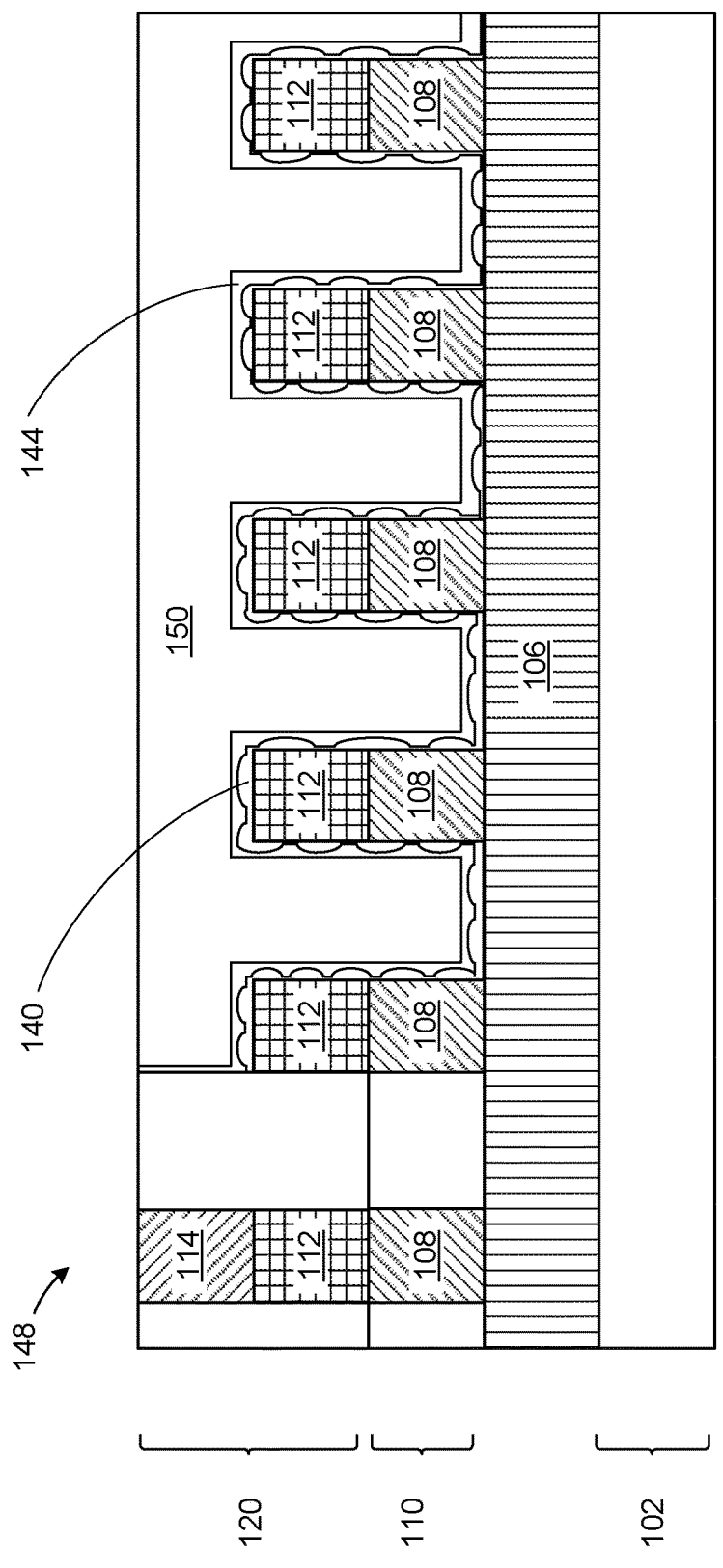
Figure 14:
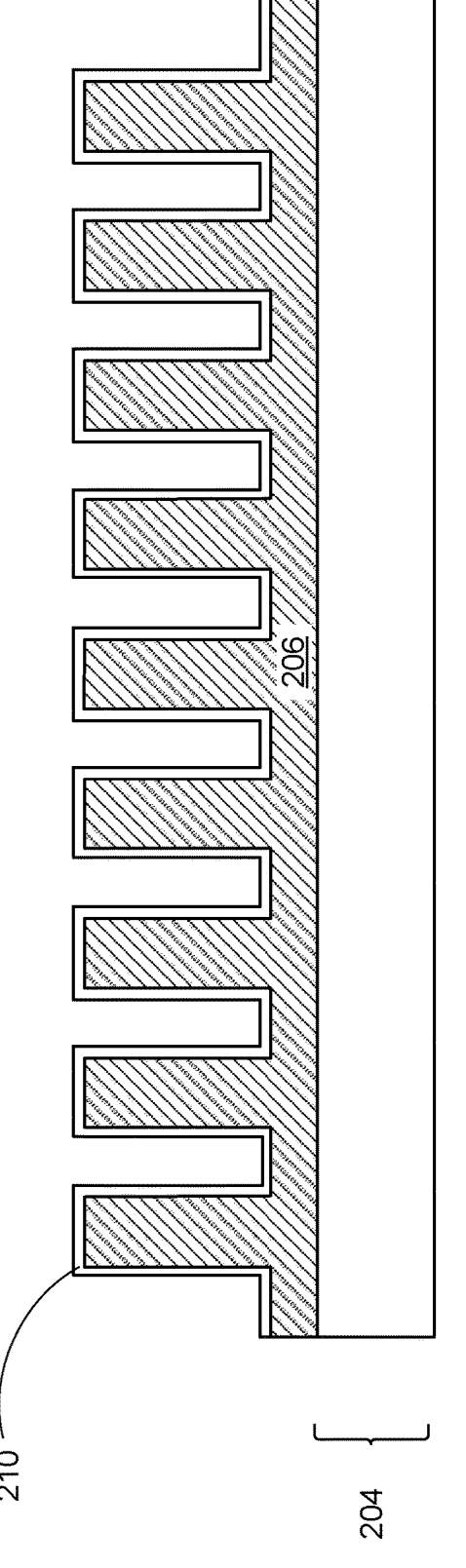
FIG. 14 illustrates a cross-sectional view of the second semiconductor structure and illustrates formation of a high-k liner, according to an exemplary embodiment.

Referring now to FIGS. 11 and 12, a cross-sectional view of the structure 101 and the structure 103 are each shown according to an exemplary embodiment. FIG. 11 is a cross-sectional view of the structure 101. FIG. 12 is a cross-sectional view of the structure 103. A high-k liner 144 and a top electrode 150 may be formed.

The high-k liner 144 may be conformally deposited on the structure 100. The high-k liner 144 may be formed by depositing or growing a dielectric material on the structure 100. The high-k liner 144 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the high-k liner 144 may include any high-k dielectrics include, but are not limited to, $HfO_2$, $ZrO_2$, $La_2O_3$, $Al_2O_3$, $TiO_2$, a high-k dielectric material (with k>4.0).

The top electrode 150 may be formed from a conductive material layer which is blanket deposited on top of the structure 100, and directly on an upper horizontal surface of the high-k liner 144, filling trenches and openings between adjacent exposed Vx-1 via 108, Mx metal line 112, and on the ILD 120 and the Vx via 114. The conductive material layer may include materials such as, for example, tungsten (W), titanium nitride (TiN) and tantalum nitride (TaN). The conductive material can be formed by for example, chemical vapor deposition (CVD), physical vapor deposition (PVD), and atomic layer deposition (ALD) or a combination thereof.

A planarization process, such as, for example, chemical mechanical polishing (CMP), may be done to remove excess material from an upper horizontal surface of the structure 100 such that upper horizontal surfaces of the Vx via 114. the ILD 120, the high-k liner 144 and the top electrode 150 are coplanar.

The Vx via 114 in the FIG. 12, identified with an arrow 148, is the contact to the bottom electrode of the MIM capacitor. The bottom electrode of the MIM capacitor is the Mx-1 metal line 106, the Vx-1 via 108 and the Mx metal line 112, each with partially nucleated metal.

The capacitance of the MIM capacitor is further increased by the increased surface area between the top electrode 150 and the bottom electrode along vertical side surfaces of several stacks of the Vx-1 via 108 via and the Mx metal line 112, an upper horizontal surface of several Mx metal lines 112 and an upper horizontal surface of the Mx-1 metal line between the several stacks of the Vx-1 108 via and the Mx metal line 112. The top electrode 150 and the bottom electrode have complimentary comb shaped structures. The bottom electrode includes a plurality of vertical pillars of the Vx-1 via 108 and the Mx metal line 112 extending up from the Mx-1 metal line. The top electrode 150 includes a plurality of vertical pillars between the vertical pillars of the bottom electrode. The bottom electrode contact is taller than the plurality of vertical pillars. A bottom layer of the bottom electrode, the Mx-1 metal line 106, may be co-planar with the first metal line, Mx-1 metal line 106 in the BEOL. In an embodiment, the top electrode 150 may be formed simultaneously as the Vx via 114, including normal function Vx via 114 which are not part of the MIM capacitory.

The high-k liner 144 is the insulator layer of the MIM capacitor. The high-k liner 144 provides insulation between the bottom electrode and the top electrode 150 of the MIM capacitor.

The MIM capacitor provides a new back end of line process to make the MIM capacitor with subtractive patterning, high capacitance and low wiring series resistance. The MIM capacitor fabrication is possible without causing physical/chemical damage to metal of the Mx-1 metal line 106, the Vx-1 via 108, the Mx metal line 112 and the Vx via 114.

The MIM capacitor may be adjacent to other BEOL interconnects, as shown in FIG. 11 and may be formed in a same level as the other BEOL interconnects.

Figure 13:
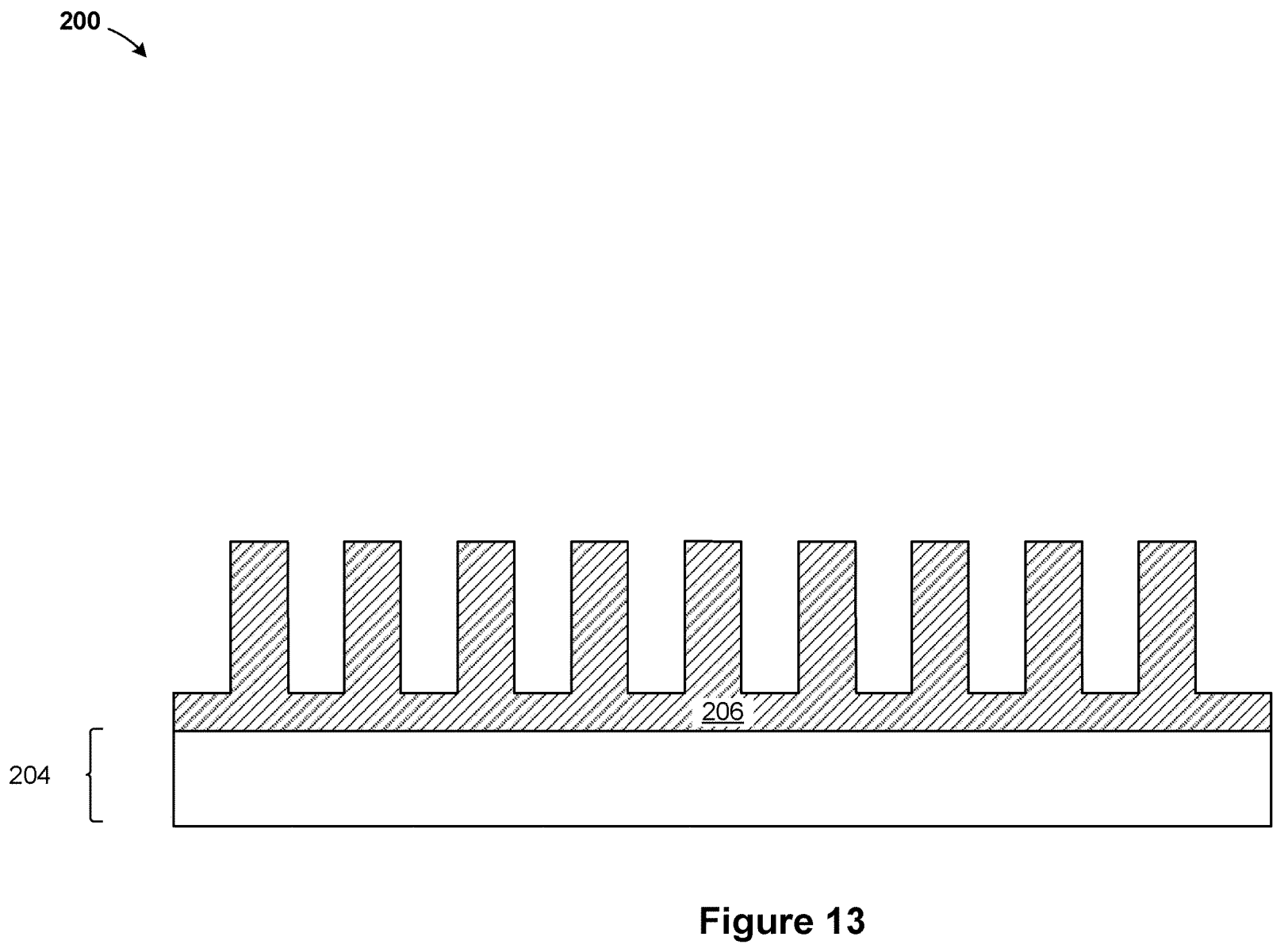

Referring now to FIG. 13, a cross-section of a semiconductor structure 200 (hereinafter "structure") at an intermediate stage of fabrication is shown according to an exemplary embodiment. The structure 200 may be formed or provided. The structure 200 may include an inter-layer dielectric (hereinafter "ILD") 204 and a bottom electrode 206.

The structure 200 may include a metal-insulator-metal (hereinafter "MIM") capacitor.

The structure 200 may include several back end of line ("BEOL") layers. In general, the back end of line (BEOL) is the second portion of integrated circuit fabrication where the individual devices (transistors, capacitors, resistors, etc.) are interconnected with wiring on the wafer.

The ILD 204 may be formed by depositing or growing a dielectric material on the BEOL layers, followed by a chemical mechanical polishing (CMP) or etch steps. The ILD 204 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the ILD 204 may include one or more layers. In an embodiment, the ILD 204 may include any dielectric material such as tetraethyl orthosilicate (TEOS), silicon oxide (SiOx), silicon nitride (SiNx), silicon boron carbonitride (SiBCN), NBLoK, a low-k dielectric material (with k<4.0) such as SiCOH, SiCNH and SiCNOH, including but not limited to, silicon oxide, spin-on-glass, a flowable oxide, a high-density plasma oxide, borophosphosilicate glass (BPSG), or any combination thereof or any other suitable dielectric material. NBLoK is a trademark of Applied Materials, Inc.

In an embodiment, the bottom electrode 206 is formed from a conductive material layer which is blanket deposited on top of the structure 100, and directly on an upper horizontal surface of the ILD 204. The conductive material layer may include materials such as, for example ruthenium (Ru), tungsten (W), molybdenum (Mo), iridium (Ir), and rhodium (Rh). The conductive material can be formed by for example, chemical vapor deposition (CVD), physical vapor deposition (PVD), and atomic layer deposition (ALD) or a combination thereof. The bottom electrode 206 is formed by damascene, or patterned from the conductive material layer, using known patterning and etching techniques. Portions of the bottom electrode 206 may be removed by selective etching, such as reactive etching (RIE), resulting in a continuous bottom portion with finger-like or comb shaped extensions of the bottom electrode 206. The bottom electrode 206 may be referred to as comb shaped. In an embodiment, the comb shaped extensions of the bottom electrode 206 may be formed at an 80 nm pitch or a 40 nm pitch. In an embodiment, the bottom electrode 206 may have a thickness ranging from about 10 nm to about 200 nm, although a thickness less than 10 nm and greater than 200 nm may be acceptable.

The conductive material layer may include materials which have lower line resistance than that of copper (Cu).

The bottom electrode 206 is an alternate method of forming the bottom electrode as compared to the bottom electrode of the structure 100. A combination of different elements of forming the bottom electrode may be combined from different embodiments.

Figure 15:
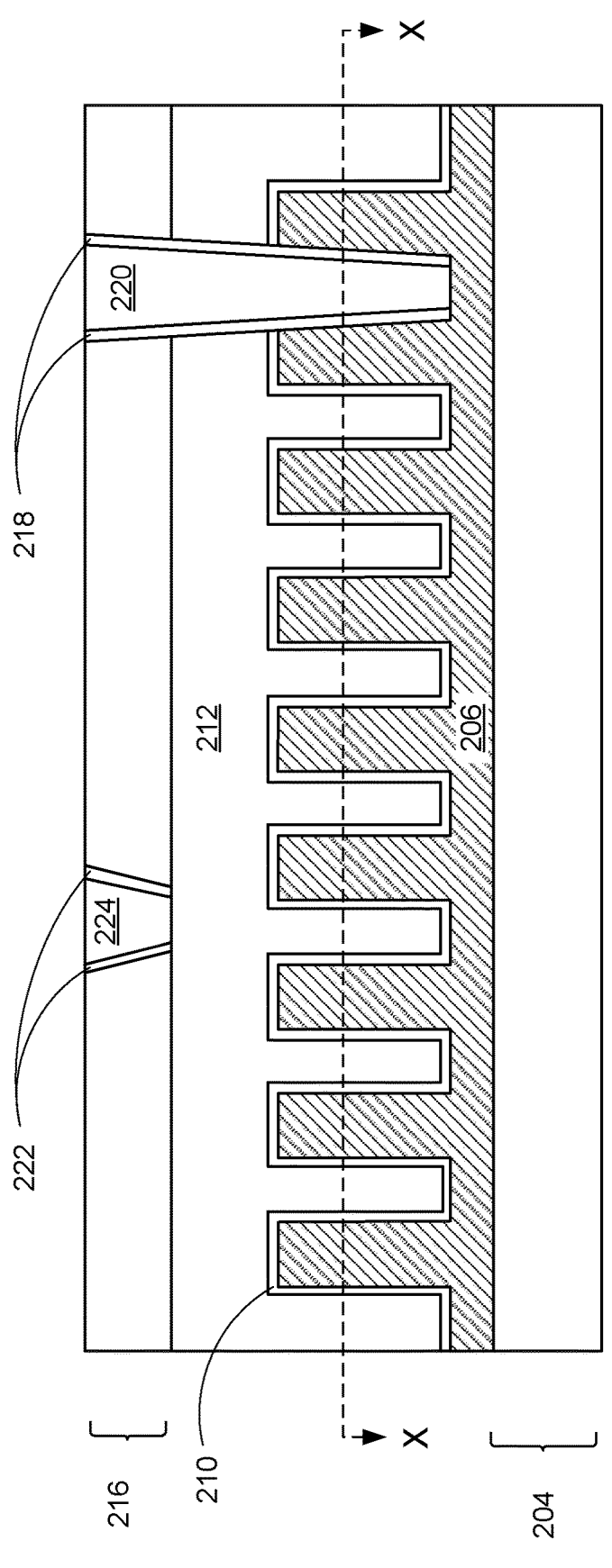
FIG. 15 illustrates a cross-sectional view of the second semiconductor structure and illustrates formation of a top electrode, an inter-layer dielectric and a contact, according to an exemplary embodiment.

Referring now to FIG. 15, a cross-sectional view of the structure 200 is shown, according to an exemplary embodiment. A high-k liner 210 and a top electrode 212 may be formed. An inter-layer dielectric (hereinafter "ILD") 216 may be formed. A liner 222 and a liner 218 may be formed. A contact 224 and a contact 220 may be formed.

The high-k liner 210 may be conformally deposited on the structure 200. The high-k liner 210 may be formed by depositing or growing a dielectric material on the structure 200. The high-k liner 210 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the high-k liner 210 may include any high-k dielectrics include, but are not limited to, $HfO_2$, $ZrO_2$, $La_2O_3$, $Al_2O_3$, $TiO_2$, a high-k dielectric material (with k>4.0)

The top electrode 212 may be formed from a conductive material layer which is blanket deposited on top of the structure 200, and directly on an upper horizontal surface of the high-k liner 210, filling trenches and openings between adjacent comb shaped extensions of the bottom electrode 206. The conductive material layer may include materials such as, for example copper (Cu), ruthenium (Ru), cobalt (Co), tungsten (W). The conductive material can be formed by for example, chemical vapor deposition (CVD), physical vapor deposition (PVD), and atomic layer deposition (ALD) or a combination thereof. The top electrode 212 is formed by damascene, or patterned from the conductive material layer, using known patterning and etching techniques. In an embodiment, the top electrode 212 may have a thickness ranging from about 10 nm to about 200 nm, although a thickness less than 10 nm and greater than 200 nm may be acceptable.

A planarization process, such as, for example, chemical mechanical polishing (CMP), may be done to remove excess material from an upper horizontal surface of the structure 200 such that an upper horizontal surface of the top electrode 212 is coplanar.

The ILD 216 may be formed conformally on the structure 200 as described for the ILD 204. A planarization process, such as, for example, chemical mechanical polishing (CMP), may be done to remove excess material from an upper horizontal surface of the structure 200 such that upper horizontal surface of the ILD 216 is coplanar.

A first opening (not shown) and a second opening (not shown) may be formed in the structure 200. The first opening may expose an upper horizontal surface of the top electrode 212. The second opening may expose an upper horizontal surface of the bottom electrode 206. The liner 222 may be formed in the first opening (not shown) and the liner 218 may be formed in the second opening (not shown).

The liner 222 and the liner 218 may be composed of, for example, niobium (Nb), niobium nitride (NbN), tungsten (W), tungsten nitride (WN), tantalum (Ta), tantalum nitride (TaN), titanium (Ti), titanium nitride (TiN), ruthenium (Ru), molybdenum (Mo), chromium (Cr), vanadium (V), palladium (Pd), platinum (Pt), rhodium (Rh), scandium (Sc), aluminum (Al) and other high melting point metals or conductive metal nitrides, or a combination thereof. The liner 222 and the liner 218 may be deposited utilizing a conventional deposition process such as, for example, CVD, plasma enhanced chemical vapor deposition (PECVD), PVD or ALD. The liner 222 and the liner 218 may be 5 nm thick, although a thickness less than or greater than 5 nm may be acceptable. The liner 222 and the liner 218 may be formed sequentially or simultaneously.

The contact 224 and the contact 220 may be formed from a conductive material layer which is blanket deposited on top of the structure 200, and directly on an upper horizontal surface of the ILD 216, filling the first and the second openings (not shown) on the liner 222 and the liner 218, respectively. The conductive material layer may include materials such as, for example copper (Cu), ruthenium (Ru), cobalt (Co), tungsten (W). The conductive material can be formed by for example, chemical vapor deposition (CVD), physical vapor deposition (PVD), and atomic layer deposition (ALD) or a combination thereof. The contact 224 and the contact 220 are formed by damascene, or patterned from the conductive material layer, using known patterning and etching techniques. The contact 224 and the contact 220 may be formed sequentially or simultaneously. The contact 224 is a contact to the top electrode 212 of the MIM capacitor. The contact 220 is a contact to the bottom electrode 206 of the MIM capacitor.

A planarization process, such as, for example, chemical mechanical polishing (CMP), may be done to remove excess material from an upper horizontal surface of the structure 200 such that upper horizontal surfaces of the contact 224, the contact 220 and the ILD 216 are coplanar.

In the structure 200, the comb shaped top electrode 212 and the complementary comb shaped bottom electrode 206 provide a MIM capacitor with a higher Q factor. The comb shaped electrodes provide high density scaling for advanced nodes. The comb shaped electrodes allow for a low real estate usage due to a high surface area/size.

The patterning of the bottom comb shaped electrode 206 is patterned using a single subtractive etch. The top electrode may be formed through physical vapor deposition (PVD), chemical vapor deposition (CVD, atomic layer deposition (ALD), or plating deposition techniques. Advantages of the single subtractive etch include elimination of void forming in the material of the bottom comb shaped electrode 206.

Figure 16:
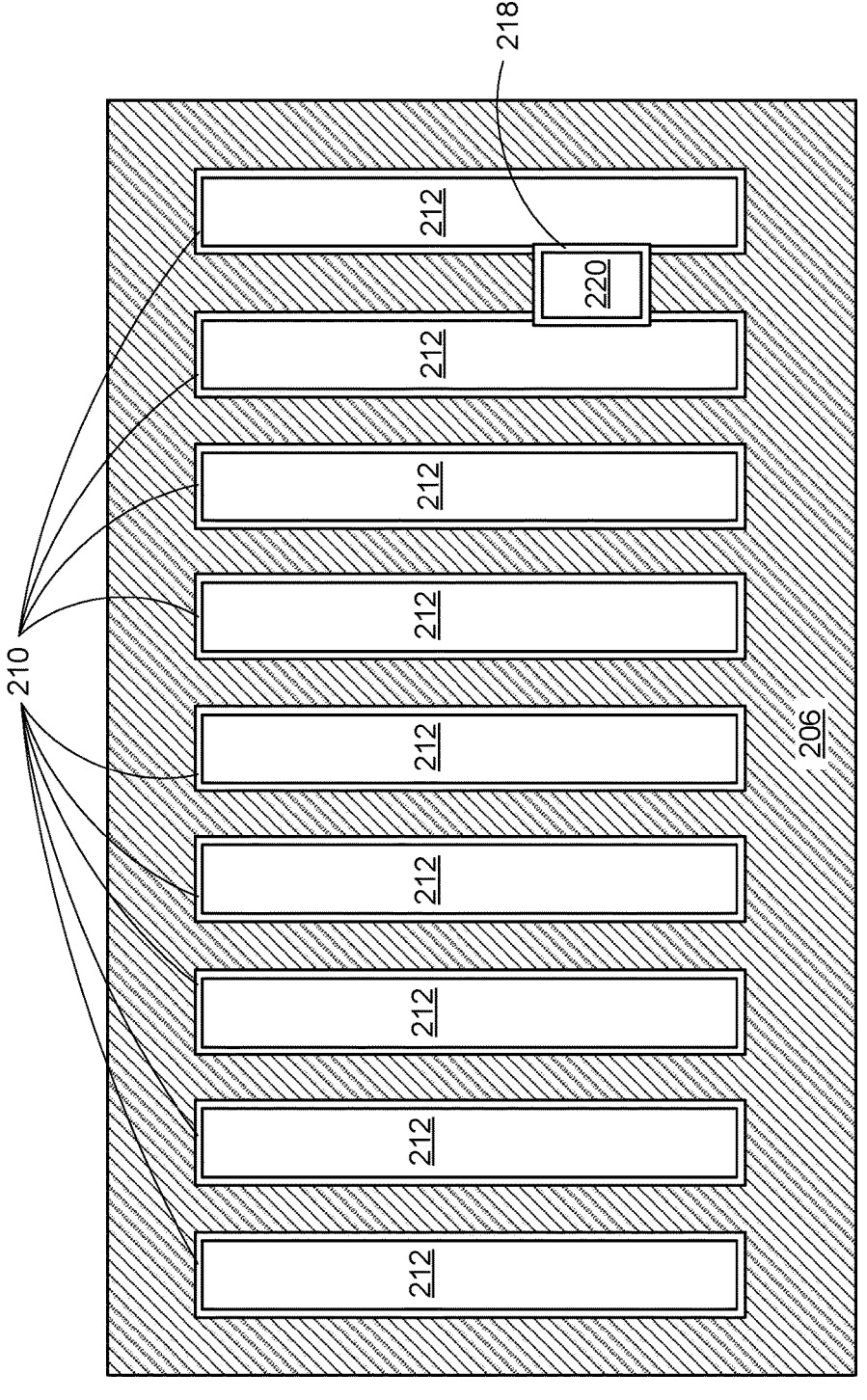
FIG. 16 illustrates a top view of the second semiconductor structure, according to an exemplary embodiment.

Referring now to FIG. 16, a top view 201 of the structure 200 is shown along section line X-X, according to an exemplary embodiment. The bottom electrode 206, the top electrode 212, the high-k liner 210, the liner 218 and the contact 220 are shown.

This is a first example of patterning of the MIM capacitor. The top electrode 212 may appear to be individual structures from the top view, although they are connected as shown in the cross sectional view of FIG. 15.

Figure 17:
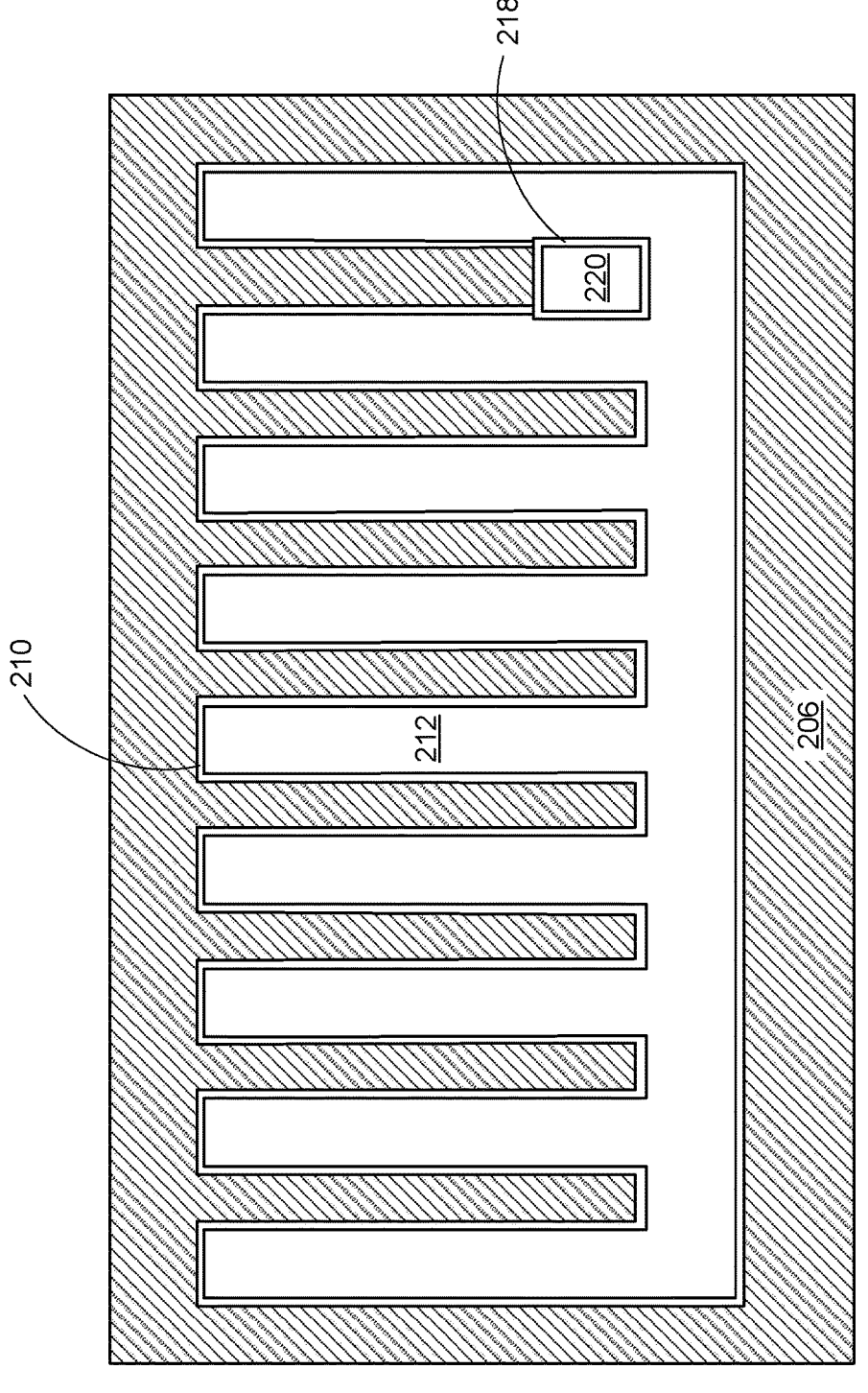
FIG. 17 illustrates an alternate version of a top view of the second semiconductor structure, according to an exemplary embodiment.
Figure 18:
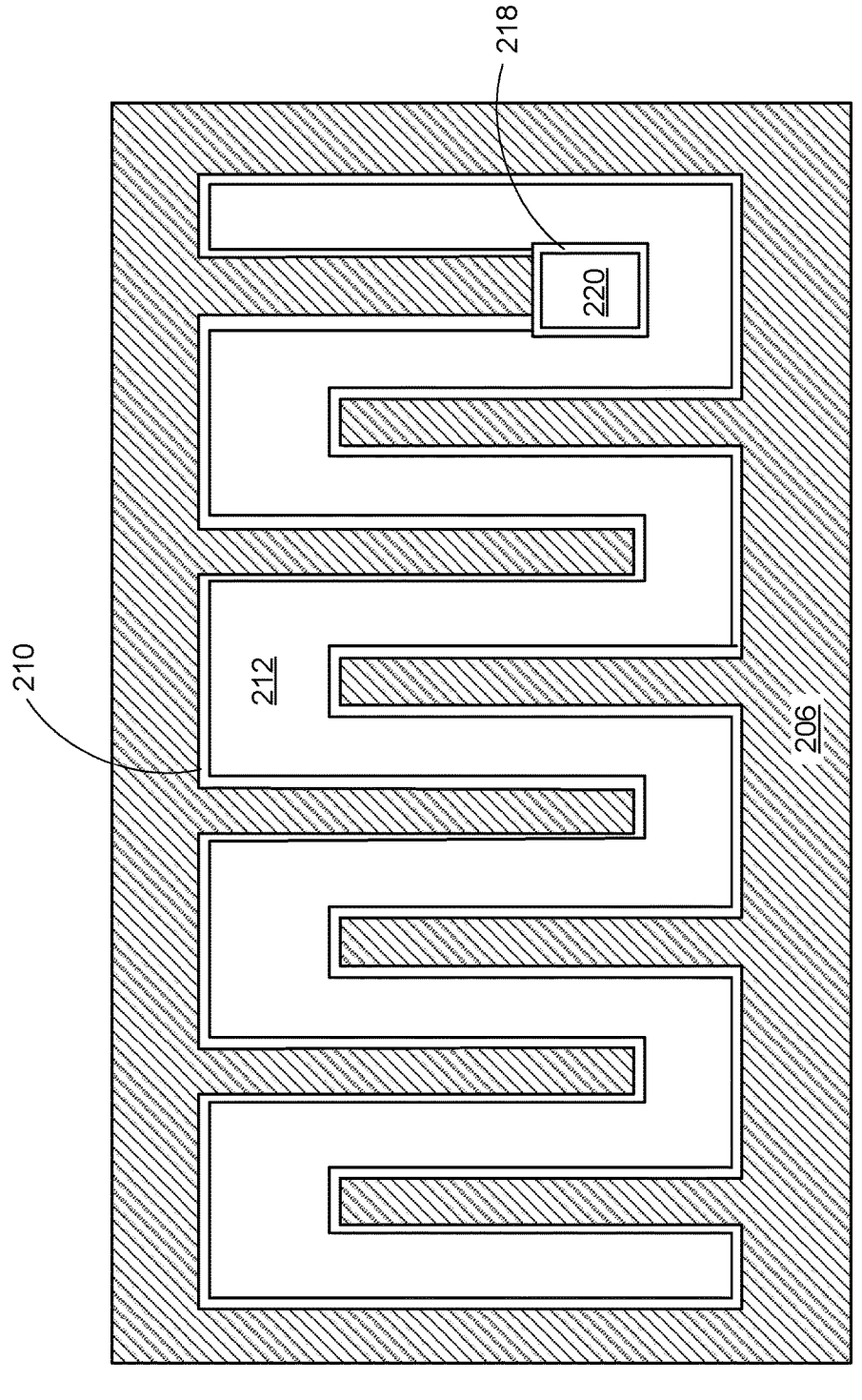
FIG. 18 illustrates an additional alternate version of a top view of the second semiconductor structure, according to an exemplary embodiment.

FIGS. 16, 17 and 18 each illustrate different patterning of the MIM capacitor from a top view.

Referring now to FIG. 17, a top view 202 of the structure 200 is shown along section line X-X, according to a second exemplary embodiment. The bottom electrode 206, the top electrode 212, the high-k liner 210, the liner 218 and the contact 220 are shown.

This is a second example of patterning of the MIM capacitor. The top electrode 212 may be referred to as having a comb like structure in the top view.

Referring now to FIG. 18, a top view 203 of the structure 200 is shown along section line X-X, according to a third exemplary embodiment. The bottom electrode 206, the top electrode 212, the high-k liner 210, the liner 218 and the contact 220 are shown.

This is a third example of patterning of the MIM capacitor. The top electrode may be referred to as having a continuous serpentine structure from the top view.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
   a metal insulator metal capacitor (MIM capacitor) within back end of line circuitry of the semiconductor device, wherein a bottom electrode of the MIM capacitor comprises a plurality of vertical pillars extending up from a bottom layer, wherein the plurality of vertical pillars comprises Vx-1 vias and Vx vias.

2. The semiconductor device according to claim 1, further comprising:
   a top electrode of the MIM capacitor, the top electrode comprising a comb like structure surrounding the plurality of vertical pillars extending up from the bottom layer of the bottom electrode.

3. The semiconductor device according to claim 1, wherein
   the bottom layer of the bottom electrode is horizontally aligned with an Mx-1 metal layer of the back end of line circuitry.

4. The semiconductor device according to claim 3, wherein an upper horizontal surface of the bottom electrode is horizontally aligned with an Mx metal line of the back end of line circuitry.

5. The semiconductor device according to claim 1, further comprising:

a metal nucleation layer conformally lining upper horizontal and vertical side surfaces of the plurality of vertical pillars of the bottom electrode, wherein the metal nucleation layer comprises an uneven rough surface which increases a surface area of the bottom electrode.

6. The semiconductor device according to claim 5, further comprising:

a high-k dielectric on upper horizontal and vertical side surfaces of the metal nucleation layer on the plurality of vertical pillars of the bottom electrode.

7. The semiconductor device according to claim 1, further comprising:

a bottom electrode contact, wherein the bottom electrode contact is horizontally aligned with a Vx via above an Mx metal line of the back end of line circuitry.

8. The semiconductor device according to claim 7, wherein the bottom electrode comprises ruthenium (Ru) and a top electrode comprises tungsten (W).

9. A semiconductor device comprising:

a metal insulator metal capacitor (MIM capacitor), wherein a bottom electrode of the MIM capacitor comprises a plurality of vertical pillars extending up from a bottom layer.

10. The semiconductor device according to claim 9, further comprising:

a top electrode of the MIM capacitor, the top electrode comprising a comb like structure surrounding the plurality of vertical pillars extending up from the bottom layer of the bottom electrode.

11. The semiconductor device according to claim 10, wherein the bottom electrode comprises ruthenium (Ru) and the top electrode comprises tungsten (W).

12. The semiconductor device according to claim 10, further comprising:

an upper horizontal surface of the bottom electrode is above a lower horizontal surface of the top electrode.

13. The semiconductor device according to claim 9, further comprising:

a high-k liner between the bottom electrode and a top electrode.

14. The semiconductor device according to claim 9, further comprising:

a bottom electrode contact connected to the bottom electrode; and a top electrode contact connected to the top electrode.

15. A method of forming a semiconductor device comprising:

forming back end of line Mx-1 metal line layer;

forming a plurality of Vx-1 via on the Mx-1 metal line layer;

forming a Mx metal line layer with subtractive patterning on the plurality of the Vx-1 via;

forming a plurality of Vx via on the Mx metal line layer with subtractive patterning; and forming a block mask protecting a portion of the semiconductor device.

16. The method according to claim 15, wherein a bottom electrode of a metal insulator metal (MIM) capacitor comprises a plurality of vertical pillars and the Mx-1 metal line layer, wherein the plurality of vertical pillars comprise a portion not protected by the block mask of the plurality of the Vx-1 via, a portion not protected by the block mask of the Mx metal line and a portion not protected by the block mask of the plurality of the Vx via.

17. The method according to claim 16, further comprising:

forming a metal nucleation layer conformally lining upper horizontal and vertical side surfaces of the plurality of vertical pillars of the bottom electrode and the Mx-1 metal line layer, wherein the metal nucleation layer comprises an uneven rough surface which increases a surface area of the bottom electrode.

18. The method according to claim 17, further comprising:

forming a high-k dielectric on upper horizontal and vertical side surfaces of the metal nucleation layer on the plurality of vertical pillars of the bottom electrode and the Mx-metal line layer of the bottom electrode.

19. The method according to claim 18, further comprising:

forming a top electrode of the MIM capacitor on the high-k dielectric, the top electrode comprising a complementary comb like structure surrounding the plurality of vertical pillars extending up from the bottom layer of the Mx-1 metal line layer of the bottom electrode.

20. The method according to claim 19, wherein the bottom electrode comprises ruthenium (Ru) and the top electrode comprises tungsten (W).

\* \* \* \* \*